(12) United States Patent
Takaishi (10) Patent No.: US 7,288,815 B2
(45) Date of Patent: Oct. 30, 2007

(54) SEMICONDUCTOR DEVICE AND MANUFACTURING METHOD THEREOF

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 148 days.

(21) Appl. No.: 10/543,533

(22) PCT Filed: Dec. 12, 2003

(86) PCT No.: PCT/JP03/15947

§ 371 (c)(1),
(2), (4) Date: Jul. 27, 2005

(87) PCT Pub. No.: WO2004/068587

PCT Pub. Date: Aug. 12, 2004

(65) Prior Publication Data

US 2006/0199319 A1    Sep. 7, 2006

(30) Foreign Application Priority Data

Jan. 28, 2003   (JP) ............................. 2003-019066

(51) Int. Cl.
*H01L 21/336* (2006.01)

(52) U.S. Cl. ...................... 257/330; 438/206; 438/209; 438/212; 438/270; 438/589; 257/E21.096; 257/E29.131; 257/E21.375; 257/E21.629; 257/E21.643

(58) Field of Classification Search ................ 438/206, 438/209, 212, 270, 589, FOR. 192; 257/330, 257/E27.096, E29.131, E29.262, E21.375, 257/E21.629, E21.643

See application file for complete search history.

(56) References Cited

U.S. PATENT DOCUMENTS

| | | | | |
|---|---|---|---|---|
| 4,873,560 A | * | 10/1989 | Sunami et al. | ............... 257/302 |
| 5,032,882 A | * | 7/1991 | Okumura et al. | ........... 257/302 |
| 2002/0158287 A1 | * | 10/2002 | Fujishima et al. | .......... 257/330 |
| 2004/0061161 A1 | * | 4/2004 | Radens et al. | ............... 257/301 |

FOREIGN PATENT DOCUMENTS

| | | |
|---|---|---|
| EP | 1168455 | 1/2002 |
| JP | 2003-243655 | 8/2003 |

* cited by examiner

*Primary Examiner*—George Fourson
(74) *Attorney, Agent, or Firm*—Rabin & Berdo, PC (57) ABSTRACT

A semiconductor device (20, 21, 22), including: a channel region (4) of a first conductivity type formed at a surface layer portion of a semiconductor substrate (1); a source region (25) of a second conductivity type which is different from the first conductivity type, the source region (25) being formed at a rim of a trench (17) having a depth sufficient to penetrate through the channel region (4); a drain region (2) of the second conductivity type formed at a region adjacent to a bottom of the trench (17); a gate insulating film (13) formed along an inner side wall of the trench (17); a gate electrode (26, 36) arranged in the trench (17) so as to be opposed to the channel region (4) with the gate insulating film (13) interposed therebetween; a conductive layer (37, 40, 40a, 40b) formed in the trench (17) so as to be nearer to the drain region (2) than the gate electrode (26, 36); and an insulating layer (15) surrounding the conductive layer (37, 40, 40a, 40b) to electrically insulate the conductive layer (37, 40, 40a, 40b) from the gate electrode (26, 36) and the drain region (2).

12 Claims, 5 Drawing Sheets

SEMICONDUCTOR DEVICE AND MANUFACTURING METHOD THEREOF

BACKGROUND OF THE INVENTION

1. Technical Field

The present invention relates to a semiconductor device having a trench structure and a manufacturing method thereof and, in particular, to a high-frequency switching MOSFET having a trench structure and a manufacturing method thereof.

2. Description of the Prior Art

Figure 5:
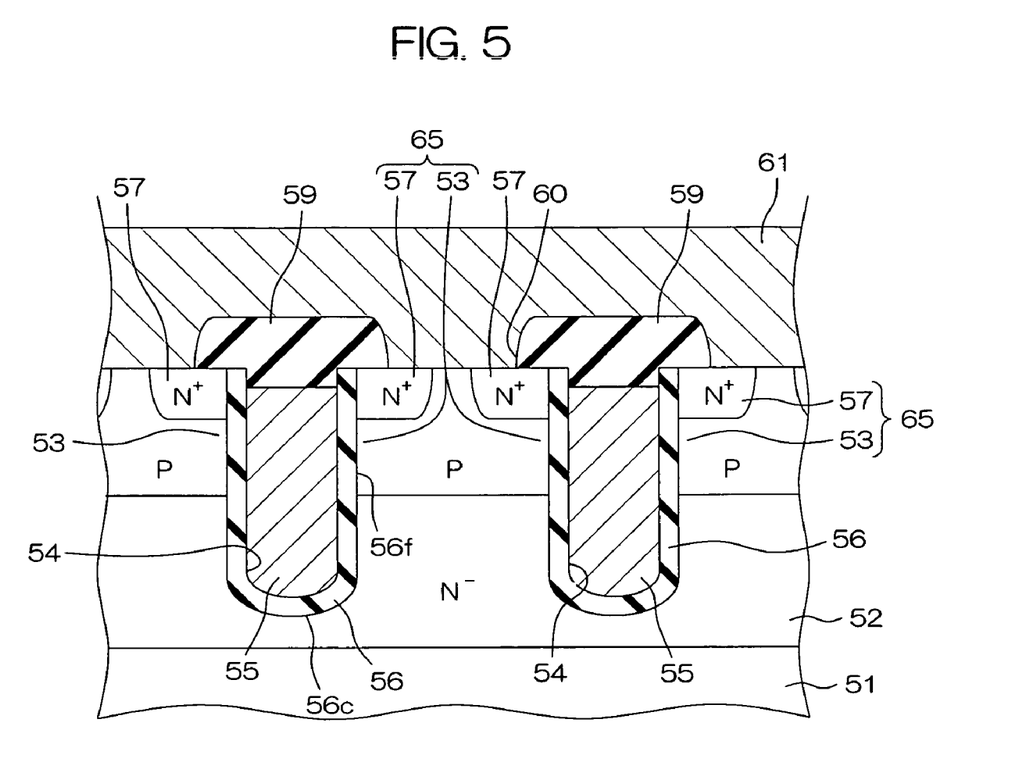
FIG. 5 is a schematic sectional view showing the structure of a semiconductor device provided with a MOSFET having a conventional trench structure.

FIG. 5 is a schematic sectional view showing the structure of a semiconductor device provided with a MOSFET having a conventional trench structure.

Formed on the surface of a silicon substrate 51 is an N⁻ epitaxial layer 52, and formed on the N⁻ epitaxial layer 52 is a diffusion region 65. A plurality of trenches 54 are formed at a uniform interval so as to penetrate through the diffusion region 65 to the middle of the N⁻ epitaxial layer 52 in the thickness direction thereof. A gate electrode 55 made of polysilicon which is made conductive by introduction of an impurity is arranged inside the trench 54.

A gate oxide film 56 is provided along the inner wall of the trench 54. That is, the gate electrode 55 is opposed to the N⁻ epitaxial layer 52 and the diffusion region 65 with the gate oxide film 56 interposed therebetween. The inner side wall of the trench 54 is formed as a substantially flat face and the bottom of the trench 54 constitutes a curved face projected to the silicon substrate 51 side. In a reflection of such a shape of the trench 54, the interface between the gate oxide film 56 and the diffusion region 65 and between the gate oxide film 56 and N⁻ epitaxial layer 52 has a flat face 56f and a curved face 56c. The flat face 56f is formed along a face at the diffusion region 65, which face has a specific plane direction to give a low resistance when electric current flows along the face.

An N⁺ source region 57 is formed at the periphery (rim) of the trench 54 in a surface layer portion of the diffusion region 65. The rest of the diffusion region 65 constitutes a channel region 53 of a P-conductivity type.

An insulating film 59 made of silicon oxide is formed so as to cover an upper part of the trench 54. The insulating film 59 also exists at the rim of the trench 54 (on the N⁺ source region 57) in a plan view. A contact hole 60 is formed between two adjacent insulating films 59. An electrode film 61 made of metal such as aluminum is provided on the diffusion region 65 and the insulating film 59. The electrode film 61 is formed so as to fill the contact hole 60.

In operation (ON state) of the above semiconductor device, electric current (drain current) flows across the N+source region 57 and the N⁻ epitaxial layer 52. The drain current flows near the gate oxide film 56 in the channel region 53, along the gate oxide film 56.

Such a semiconductor device is disclosed in, for example, Japanese Unexamined Patent Publication No. 8-167711 (1966).

A semiconductor device constructed as described above, however, cannot be used suitably for high-frequency switching (a DC-DC converter, for example). Although low ON resistance and low switching loss are required for a semiconductor device to be used for such purpose, a semiconductor device constructed as described above cannot strike a balance between reduction of ON resistance and reduction of switching loss. This is for the following reason.

Drain current, which flows near the gate oxide film 56 along the gate oxide film 56, is to flow along the curved face 56c when the current comes near the curved face 56c, in a state where the channel region 53 is in contact with the curved face 56c. Therefore, since the path of the drain current includes a path which deviates from a face having a plane direction to give a low resistance, the ON resistance is increased. Accordingly, in order to decrease the ON resistance, the channel region 53 needs to be in contact only with the flat face 56f of the gate oxide film 56 as shown in FIG. 5. That is, the curved face 56c is made contact with the N⁻ epitaxial layer 52 by the whole area.

This, however, causes increase of the area of an opposed portion of the gate electrode 55 and the N⁻ epitaxial layer 52, increase of the capacity between the N⁻ epitaxial layer 52 and the gate electrode 55, i.e. a drain-gate capacity CDG, and increase of the switching loss.

A semiconductor device constructed as described above has difficulty in operating satisfactorily by a frequency of 1 MHz, though the device can operate and be used by a frequency of 300 kHz, for example.

When forming the bottom of the trench 54 into a flat face and forming the trench 54 to be shallow with respect to the N⁻ epitaxial layer 52, it is possible to decrease the area of an opposed portion of the gate electrode 55 and the N⁻ epitaxial layer 52 and to decrease the drain-gate capacity $C_{DG}$. It is, however, difficult to form the trench 54 in such a shape and, even if possible, a corner portion is formed between the bottom of the trench 54 and the inner sidewall and, therefore, favorable characteristics cannot be provided due to concentration of an electric field on this corner portion.

SUMMARY OF THE INVENTION

An object of the present invention is to provide a semiconductor device capable of reducing the ON resistance while reducing the switching loss.

Another object of the present invention is to provide a manufacturing method of a semiconductor device capable of reducing the ON resistance while reducing the switching loss.

The present invention relates to a semiconductor device comprising: a channel region of a first conductivity type formed at a surface layer portion of a semiconductor substrate; a source region of a second conductivity type which is different from the first conductivity type, the source region being formed at a rim of a trench having a depth sufficient to penetrate through the channel region; a drain region of the second conductivity type formed at a region adjacent to a bottom of the trench; a gate insulating film formed along an inner side wall of the trench; a gate electrode arranged in the trench so as to be opposed to the channel region with the gate insulating film interposed therebetween; a conductive layer formed in the trench so as to be nearer to the drain region than the gate electrode; and an insulating layer surrounding the conductive layer to electrically insulate the conductive layer from the gate electrode and the drain region.

With the present invention, since the gate electrode is maintained at an electric potential higher than or equal to a certain level, it is possible to pass electric current (drain current) between the source region and the drain region via the channel region. That is, this semiconductor device functions as a MOSFET (Metal-Oxide-Semiconductor Field Effect Transistor).

An insulating film, a conductive layer (including a semiconductor layer which is made conductive: the same applies to the following description) and an insulating film are arranged in this order between the gate electrode and the drain region. Accordingly, a portion extending from the gate electrode to the drain region is equivalent to a plurality of capacitors connected in series. When there is one conductive layer, for example, it can be considered that two capacitors are connected in series between the gate electrode and the drain region. Since the combination capacity of a plurality of capacitors connected in series is smaller than the capacity of each capacitor, the capacity between the gate electrode and the drain region is reduced.

Moreover, a plurality of conductive layers may be formed with the insulating layers also formed between the plurality of conductive layers. In this case, a portion extending from the gate electrode to the drain region is equivalent to three or more capacitors connected in series and the capacity between the gate electrode and the drain region is further reduced.

The inner side wall of the trench may be formed into a substantially flat face and this flat face may be a face in the channel region, the face having a specific plane direction to give a low resistance when electric current flows along the face. When the bottom of the trench is formed as a curved face, it is possible to oppose the whole area of this curved face to the drain region and oppose only a flat face of the trench to the channel region.

As a result, since the drain current can flow only along the face having a plane direction to give a low resistance, it is possible to decrease the ON resistance. Moreover, even when the gate electrode is opposed to the drain region by a large area along this curved face, it is possible to decrease the switching loss of this semiconductor device since the capacity therebetween is small.

An epitaxial layer may be formed on the surface of the semiconductor substrate and, in this case, the channel region, the source region and the drain region may be formed in the epitaxial layer.

When a semiconductor portion of this semiconductor device is made of silicon, a portion of the insulating layer, the portion existing between the conductive layer and the drain region, and the gate insulating film may be made of silicon oxide, for example, obtained by oxidizing the inner side wall of this trench.

The conductive layer may be made of polysilicon which is made conductive by introduction of an impurity.

Formation of polysilicon which is made conductive by introduction of an impurity is commonly performed in manufacturing processes of a semiconductor device. Accordingly, it is needless to use a special device for formation of such a conductive layer made of polysilicon. Polysilicon which is made conductive can be obtained by, for example, forming a polysilicon film by CVD (Chemical Vapor Deposition) and then performing ion implantation of an impurity for this polysilicon film.

In this case, a portion of the insulating film, the portion existing between the conductive layer and the gate electrode, may be made of oxide silicon obtained by oxidizing a portion of the conductive layer.

A manufacturing method of a semiconductor device of the present invention is a manufacturing method of a semiconductor device comprising: a channel region of a first conductivity type formed at a surface layer portion of a semiconductor substrate; a source region of a second conductivity type which is different from the first conductivity type, the source region being formed at a rim of a trench having a depth sufficient to penetrate through the channel region; a drain region of the second conductivity type formed at a region adjacent to a bottom of the trench; a gate insulating film formed along an inner side wall of the trench; a gate electrode arranged in the trench so as to be opposed to the channel region with the gate insulating film interposed therebetween; a conductive layer formed in the trench so as to be nearer to the drain region than the gate electrode; and an insulating layer surrounding the conductive layer to electrically insulate the conductive layer from the gate electrode and the drain region.

This method includes: a step of forming an epitaxial layer of the second conductivity type at a surface layer portion of a semiconductor substrate; a step of forming the trench at this epitaxial layer; a step of forming a first insulating layer at a bottom of the trench; a step of forming the conductive layer on the first insulating layer in the trench after the step of forming this first insulating layer; a step of forming a second insulating layer at an exposed surface of this conductive layer after the step of forming this conductive layer, the second insulating layer composing the insulating layer together with the first insulating layer; a step of forming the gate insulating film along the inner side wall of the trench; a step of forming the gate electrode in the trench, the gate electrode being electrically insulated from the conductive layer by the insulating layer; a step of forming the channel region of the first conductivity type at the epitaxial layer, the channel region being to be opposed to the gate electrode with the gate insulating film interposed therebetween; and a step of forming the source region of the second conductivity type at a region of the epitaxial layer corresponding to a rim of the trench.

The drain region may be the rest of the epitaxial layer after the channel region and the source region are formed, for example.

The step of forming the channel region and the step of forming the source region may be implemented before the step of forming the trench or after the step of forming the trench.

The step of forming the first insulating layer may include a step of forming a sacrificial oxide film by performing thermal oxidation for an inner wall of the trench and a step of removing the sacrificial oxide film with a portion thereof existing at a bottom of the trench being left and, in this case, the step of forming the second insulating layer may include a step of oxidizing an exposed surface of the conductive layer.

With this arrangement, it is possible to flatten the inner wall of the trench, from which the sacrificial oxide film has been removed, by formation and removal of the sacrificial oxide film. As a result, the drain current can flow in the channel region along a specific face having a plane direction to give a low resistance, and it is therefore possible to reduce the ON resistance.

It is only necessary to remove the sacrificial oxide film from a portion on which the gate insulating film is to be formed, i.e. an opposed portion of the gate electrode and the channel region, and the sacrificial oxide film of the other portion can be left to be a part of the insulating layer. As a result, it is possible to form the insulating layer without increasing the processes significantly. The other portion of the insulating layer may be formed by oxidizing the exposed surface of the conductive layer. When forming the gate insulating film by thermal oxidation, the exposed surface of the conductive layer can be oxidized simultaneously.

The step of forming the gate electrode may include a step of forming a polysilicon film which is made conductive by introduction of an impurity.

The above or further objects, features and effects of the present invention will become more fully apparent from the following explanation of embodiments with reference to the accompanying drawings.

DESCRIPTION OF THE PREFERRED EMBODIMENTS

Figure 1:
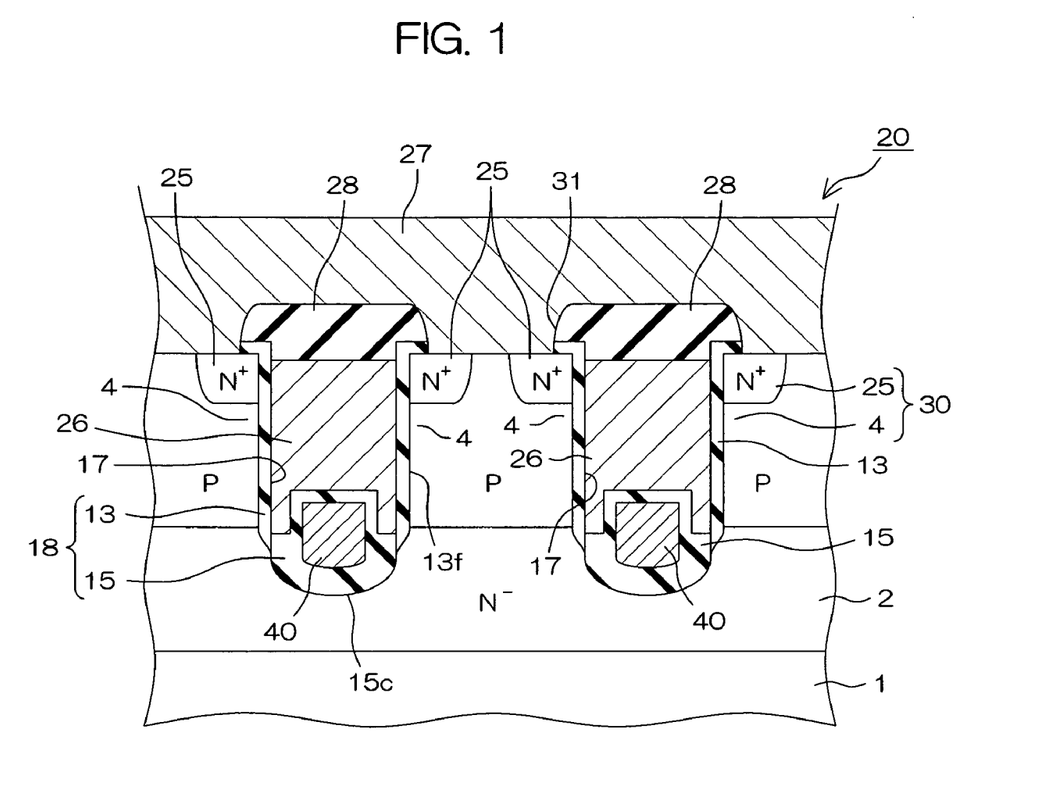
FIG. 1 is a schematic sectional view showing the structure of a semiconductor device according to an embodiment of the present invention.

FIG. 1 is a schematic sectional view showing the structure of a semiconductor device 20 according to an embodiment of the present invention. The semiconductor device 20 is a high-frequency switching MOSFET.

Formed on the surface of a silicon substrate 1 is an N⁻ epitaxial layer 2, and formed on the N⁻ epitaxial layer 2 is a diffusion region 30. A plurality of trenches 17 are formed at a uniform interval so as to penetrate through the diffusion region 30 to the middle of the N⁻ epitaxial layer 2 in the thickness direction thereof. The respective trenches 17 extend substantially parallel to each other in a direction vertical to the paper surface of FIG. 1. The inner side wall of the trench 17 is formed as a substantially flat face and the bottom of the trench 17 is formed as a curved face projected to the silicon substrate 1 side.

A conductive layer 40 and a gate electrode 26 made of polysilicon which is made conductive by introduction of an impurity are arranged in side the trench 17. The conductive layer 40 is arranged at a region of a deep portion (N⁻ epitaxial layer 2 side) of the trench 17, which region is opposed to the N⁻ epitaxial layer 2 and the diffusion region 30. The gate electrode 26 is arranged separately from the conductive layer 40 at a portion shallower than the conductive layer 40 in the trench 17. Moreover, the gate electrode 26 is interposed between the diffusion region 30 and the conductive layer 40 at a deep portion of the trench 17.

A gate oxide film 13 is formed at a region extending along the inner wall of the trench 17. The gate electrode 26 is opposed to the diffusion region 30 with the gate oxide film 13 interposed therebetween. The conductive layer 40 is surrounded by an oxide layer 15. Accordingly, the oxide layer 15 exists between the conductive layer 40 and the gate electrode 26 and between the conductive layer 40 and the N⁻ epitaxial layer 2. As a result, the conductive layer 40 is electrically insulated from the gate electrode 26 and the N⁻ epitaxial layer 2. The gate electrode 26 is electrically insulated from the N⁻ epitaxial layer 2 by the gate oxide film 13 and the oxide layer 15. The gate oxide film 13 and the oxide layer 15 compose an integrated oxide film 18.

The interface between the gate oxide film 13 and the diffusion region 30 is formed into a substantially flat face 13f as a reflection of the shape of the trench 17. The flat face 13f is formed along a face at a channel region 4, which face has a specific plane direction to give a low resistance when electric current flows along the face. The specific plane direction is (1, 0, 0), for example. Moreover, the interface between the oxide layer 15 and the N⁻ epitaxial layer 2 has a curved face 15c projected to the silicon substrate 1 side as a reflection of the shape of the trench 17. The diffusion region 30 is in contact only with the flat face 13f of the oxide film 18 and is not in contact with the curved face 15c.

An N⁺ source region 25 is formed at a surface layer portion of the diffusion region 30 and the rest of the diffusion region 30 constitutes the P-type channel region 4. The N⁺ source region 25 is formed at the periphery (rim) of the trench 17.

Formed on the gate electrode 26 is an insulating film 28 made of oxide silicon. The insulating film 28 extends to the rim of the trench 17 (on the N⁺ source region 25) in a plan view. A contact hole 31 is formed between two adjacent insulating films 28. An electrode film 27 made of metal such as aluminum is provided on the diffusion region 30 and the insulating film 28. The electrode film 27 is formed so as to fill the contact hole 31 and is in contact with the diffusion region 30 exposed in the contact hole 31.

In the above semiconductor device 20, drain current flows across the N⁺ source region 25 and the N⁻ epitaxial layer 2 when appropriate voltage is applied between the N⁺ source region 25 and the N⁻ epitaxial layer 2 to maintain the gate electrode 26 at an electric potential higher than or equal to a certain level. That is, the N⁻ epitaxial layer 2 functions as a drain region.

The drain current flows in the channel region 4 along the gate oxide film 13. Here, the drain current flows along the flat face 13f of the gate oxide film 13 and does not flow along the curved face 15c. Accordingly, since the drain current can flow in the channel region 4 along the face having the specific plane direction to give a low resistance, the ON resistance is low. The ON resistance of such a semiconductor device 20 can be 5 mΩ to 7 mΩ or lower, for example.

Moreover, the oxide layer 15, the conductive layer 40 and the oxide layer 15 are arranged in this order between the gate electrode 26 and the N⁻ epitaxial layer 2. Accordingly, a portion extending from the gate electrode 26 to the N⁻ epitaxial layer 2 is equivalent to two capacitors connected in series. The combination capacity of two capacitors connected in series is smaller than the capacity of each capacitor. Therefore, even though the gate electrode 26 is opposed to the N⁻ epitaxial layer 2 by a large area via the curved face 15c, the capacity between the gate electrode 26 and the N⁻ epitaxial layer 2, i.e. a drain-gate capacitor $C_{DG}$, is reduced. Accordingly, the switching loss of such a semiconductor device 20 is low.

When driving a CPU (Central Processing Unit) by 1 MHz using such a semiconductor device 20 (MOSFET), the power conversion efficiency (ratio of output power to input power) of a case of driving the CPU by 1.3V can be approximately 85% and the power conversion efficiency of a case of driving the CPU by 3.3V or 5V can be approximately 90%.

FIG. 2(a) to FIG. 2(g) are schematic sectional views for explaining a manufacturing method of the semiconductor device 20 shown in FIG. 1.

Figure 2A:
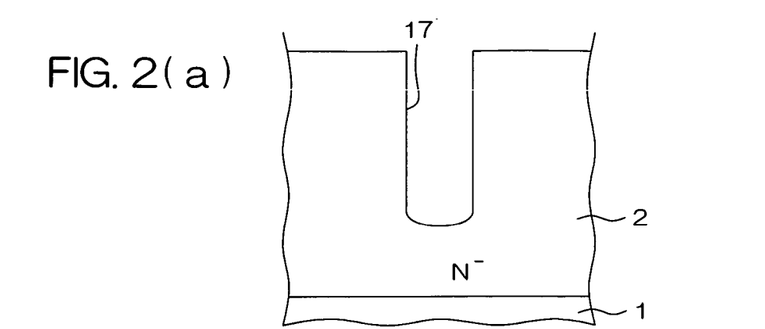
FIG. 2(a), FIG. 2(b), FIG. 2(c), FIG. 2(d), FIG. 2(e), FIG. 2(f) and FIG. 2(g) are schematic sectional views for explaining a manufacturing method of the semiconductor device shown in FIG. 1.

First, the N⁻ epitaxial layer 2 is formed on the surface of the silicon substrate 1. Then, the trench 17 having a predetermined depth is formed by reactive ion etching (RIE). The bottom of the trench 17 is formed as a curved face projected to the silicon substrate 1 side. This state is shown in FIG. 2(a).

Figure 2B:
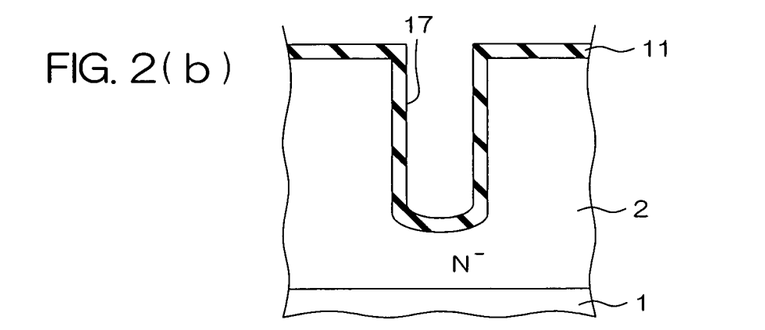
Figure 2C:
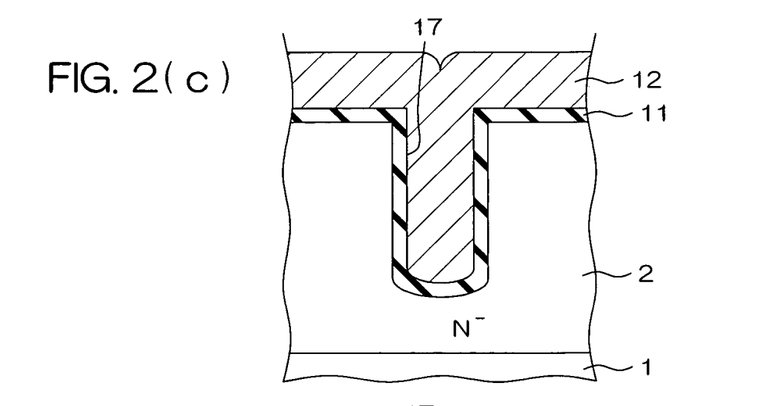
Figure 2D:
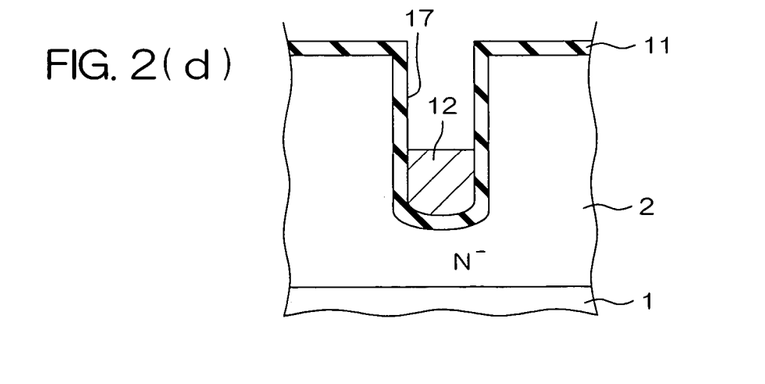

Next, the exposed surface of the semiconductor substrate 1 which has undergone the above processes, i.e. the inner wall of the trench 17 and the surface of the N⁻ epitaxial layer 2, undergoes thermal oxidation, so that a sacrificial oxide film 11 is formed. The thickness of the sacrificial oxide film 11 is, for example, approximately 1500 Å to 3000 Å (approximately 2000 Å, for example). This state is shown in FIG. 2(b).

Then, a polysilicon film 12 is formed on the silicon substrate 1, which has undergone the above processes, by CVD (Chemical Vapor Deposition) so as to fill the inside of the trench 17 (see FIG. 2 (c)). Then, an impurity is introduced into the polysilicon film 12 to make the polysilicon film 12 conductive. Furthermore, the polysilicon film 12 undergoes etching back with a portion existing at the bottom of the trench 17 (portion of the silicon substrate 1 side) being left (see FIG. 2(d)).

Figure 2E:
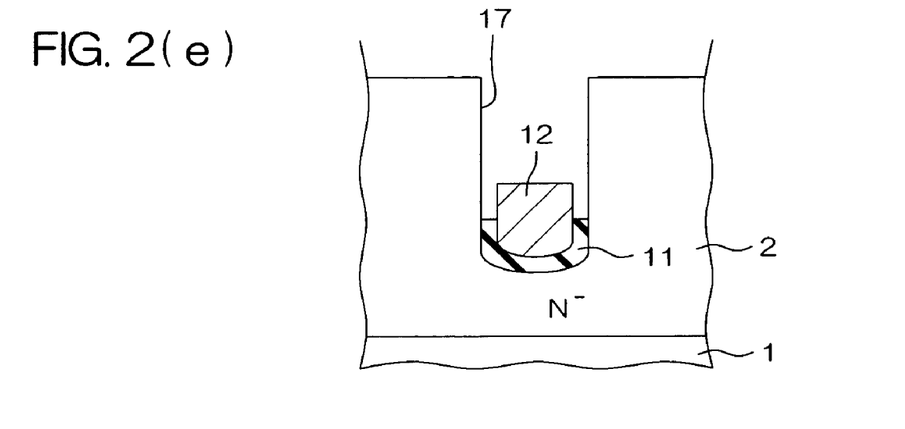

Then, the sacrificial oxide film 11 under goes etching back. Here, a portion of the side wall of the polysilicon film 12 is exposed so that the sacrificial oxide film 11 (portion at the bottom side of the trench 17) between the $N^-$ epitaxial layer 2 and the polysilicon film 12 is left.

The width of the trench 17 at a portion from which the sacrificial oxide film 11 has been removed is slightly larger. Moreover, the inner wall of the trench 17 from which the sacrificial oxide film 11 has been removed is formed into a substantially flat face. This state is shown in FIG. 2(e).

Figure 2F:
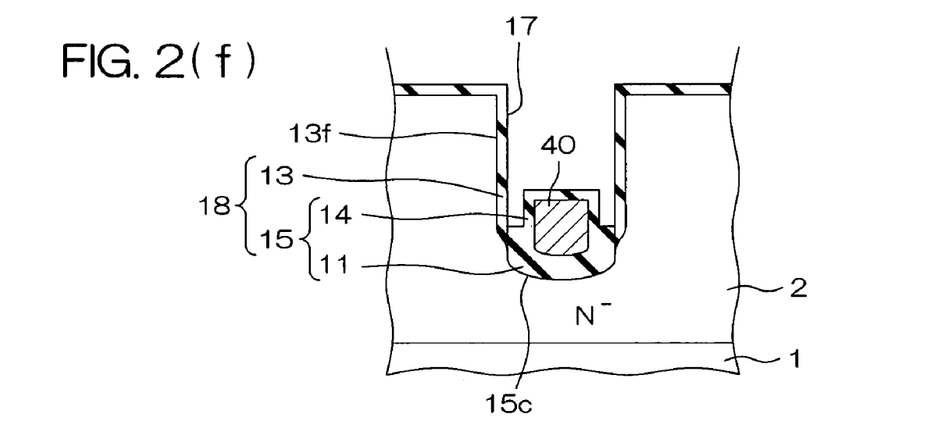

Next, the exposed surface of the silicon substrate 1 which has undergone the above processes undergoes thermal oxidation. As a result, the gate oxide film 13 is formed at the inner side wall of the trench 17 and an oxide film 14 is formed on the exposed surface of the polysilicon film 12. The thickness of the gate oxide film 13 is, for example, 200 Å to 600 Å. The rest of the polysilicon film 12 constitutes the conductive layer 40. The rest of the sacrificial oxide film 11 and the oxide film 14 compose the oxide layer 15 surrounding the conductive layer 40 and the oxide layer 15 and the gate oxide film 13 compose the integrated oxide film 18.

The interface between the gate oxide film 13 and the diffusion region 30 is formed into the substantially flat face 13f as a reflection of the shape of the trench 17. The interface between the oxide layer 15 and the $N^-$ epitaxial layer 2 has the curved face 15c as a reflection of the shape of the trench 17. This state is shown in FIG. 2(f).

Then, a polysilicon film is formed by CVD so as to fill the inside of the trench 17 and an impurity is introduced into this polysilicon film to make the film conductive. A portion of this polysilicon film existing outside the trench 17 is then removed. The rest of the polysilicon film constitutes the gate electrode 26.

Next, ion implantation is performed for the N epitaxial layer 2 with a mask having an aperture of a predetermined pattern to form the P-type channel region 4. Furthermore, ion implantation is performed for the channel region 4 with a mask having an aperture of another pattern to form the $N^+$ source region 25. The channel region 4 and the $N^+$ source region 25 compose the diffusion region 30.

In formation of the diffusion region 30, the depth of ion implantation is controlled so that the diffusion region 30 comes in contact only with the flat face 13f of the oxide film 18 and not with the curved face 15c. Moreover, the diffusion region 30 is opposed to the gate electrode 26 by the whole area with the gate oxide film 13 interposed therebetween.

Figure 2G:
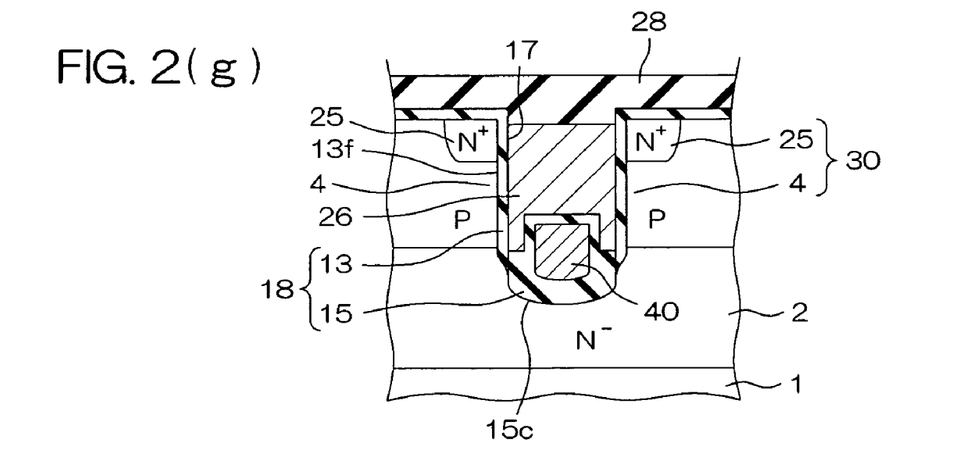

The insulating film 28 made of oxide silicon is then formed on the whole area of the silicon substrate 1, which has undergone the above processes, by CVD (see FIG. 2(g)). The contact hole 31 is then formed at the insulating film 28 using a mask having an aperture of a predetermined pattern.

Furthermore, the electrode film 27 made of aluminum or the like is formed on the whole area of the silicon substrate 1, which has undergone the above processes, to obtain the semiconductor device 20 shown in FIG. 1.

After forming the sacrificial oxide film 11 in the above manufacturing method of the semiconductor device 20, this sacrificial oxide film 11 is not removed completely but a part thereof existing between the polysilicon film 12 and the $N^-$ epitaxial layer 2 is left. Accordingly, the oxide layer 15 can be formed without increasing the processes significantly.

Furthermore, when thickening the sacrificial oxide film 11, the thickness of the oxide layer 15 existing between the conductive layer 40 and the $N^-$ epitaxial layer 2 can be increased. With this modification, it is also possible to reduce the capacity between the gate electrode 26 and the $N^-$ epitaxial layer 2 and to reduce the switching loss.

Figure 3:
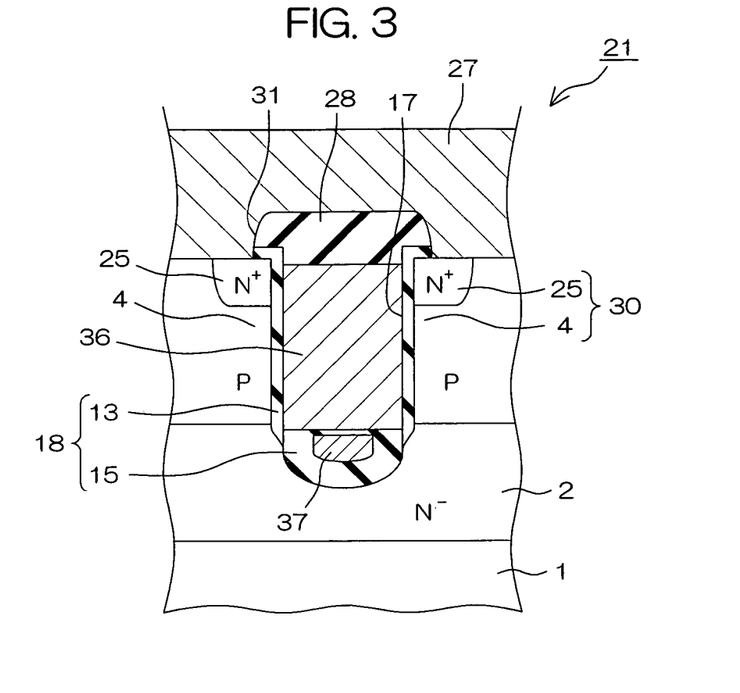
FIG. 3 is a schematic sectional view showing the structure of a semiconductor device according to another embodiment of the present invention.

FIG. 3 is a schematic sectional view showing the structure of a semiconductor device 21 according to another embodiment of the present invention. Like reference symbols are used to refer to parts corresponding to the respective parts of the semiconductor device 20 shown in FIG. 1 and explanation thereof is omitted.

In this semiconductor device 21, a gate electrode 36 and a conductive layer 37 are provided corresponding respectively to the gate electrode 26 and the conductive layer 40 of the semiconductor device 20 shown in FIG. 1. A portion of the gate electrode 26 in the semiconductor device 20 is interposed between the $N^-$ epitaxial layer 2 and the conductive layer 40 while the gate electrode 36 in this semiconductor device 21 is not interposed between the $N^-$ epitaxial layer 2 and the conductive layer 37. The gate electrode 36 and the conductive layer 37 are compartmentalized by the substantially flat oxide layer 15.

Such a semiconductor device 21 can be obtained by preventing the sacrificial oxide film 11 between the $N^-$ epitaxial layer 2 and the polysilicon film 12 from being removed in the step of removing the sacrificial oxide film 11 in the manufacturing method of the semiconductor device 20 (see FIG. 2(e)). That is, it is only necessary to stop etching back of the sacrificial oxide film 11 when the etched back face of the polysilicon film 12 (face opposite to the silicon substrate 1 side) and the etching back face of the sacrificial oxide film 11 form substantially the same face.

Figure 4:
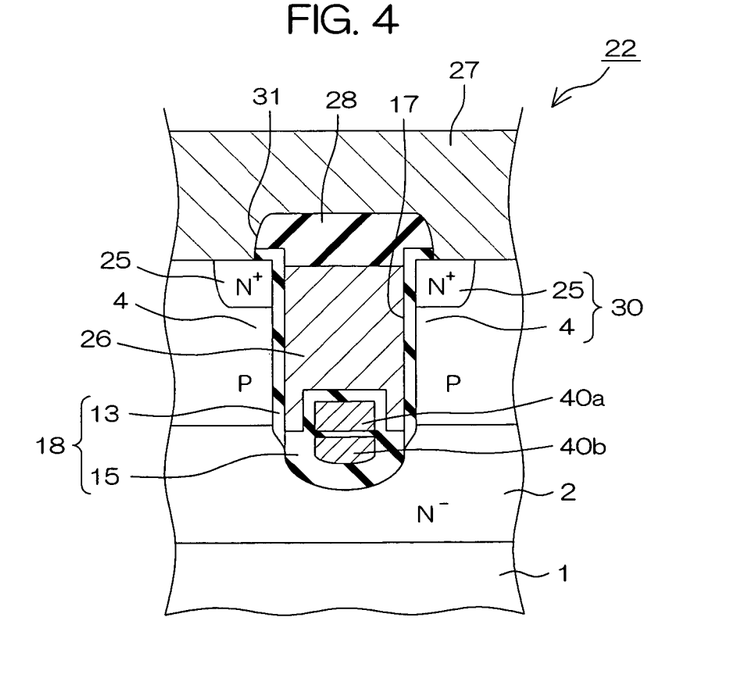
FIG. 4 is a schematic sectional view showing the structure of a semiconductor device according to yet another embodiment of the present invention.

FIG. 4 is a schematic sectional view showing the structure of a semiconductor device 22 according to yet another embodiment of the present invention. Like reference symbols are used to refer to parts corresponding to the respective parts of the semiconductor device 20 shown in FIG. 1 and explanation thereof is omitted.

Only one conductive layer 40 is formed in the semiconductor device 20 shown in FIG. 1 while two conductive layers 40a and 40b are formed in this semiconductor device 22. The conductive layers 40a and 40b are arranged along the depth direction of the trench 17 and the oxide layer 15 also exists between the conductive layer 40a and the conductive layer 40b.

Accordingly, the oxide layer 15, the conductive layer 40a, the oxide layer 15, the conductive layer 40b and the oxide layer 15 are arranged in this order between the gate electrode 26 and the $N^-$ epitaxial layer 2. As a result, a portion extending from the gate electrode 26 to the $N^-$ epitaxial layer 2 is equivalent to three capacitors connected in series and it is possible to further reduce the capacity between the gate electrode 26 and the $N^-$ epitaxial layer 2. Accordingly, it is possible with the semiconductor device 22 to further reduce the switching loss in comparison with the semiconductor devices 20 and 21.

Three or more conductive layers may be provided instead of the conductive layers 40, 40a and 40b.

Such a semiconductor device 22 can be obtained as described hereinafter. The processes up to formation of the gate oxide film 13 by thermal oxidation (see FIG. 2(f)) are implemented similarly as the manufacturing method of the semiconductor device 20. Then, a polysilicon film similar to the polysilicon film 12 is formed in the trench 17, an impurity is introduced into this polysilicon film to make the film conductive and then this polysilicon film undergoes etching back. The rest of the polysilicon film constitutes the conductive layer 40a.

Next, the exposed surface of the conductive layer 40a undergoes thermal oxidation, then a polysilicon film similar to the polysilicon film 12 is formed, an impurity is introduced into this polysilicon film to make the film conductive and then, furthermore, a portion of this polysilicon film existing outside the trench 17 undergoes etching back. The rest of the polysilicon film constitutes the gate electrode 26.

The gate electrode 26 and the conductive layers 40, 40a and 40b may be made of metal such as tungsten (W).

Although the channel region 4 and the $N^+$ source region 25 are formed before forming the trench 17 in the above embodiments, they may be formed after forming the trench 17.

Although any of the semiconductor devices according to the above embodiments are described with an example of an N-channel transistor, a semiconductor device may be a P-channel transistor.

Although embodiments of the present invention have been explained in detail, the embodiments are merely illustrative examples to be used for clarifying the technical content of the present invention and, therefore, the present invention should not be interpreted as being limited by these illustrative examples and the spirit and scope of the present invention are limited only by the appended claims.

The present application corresponds to Japanese Patent Application No. 2003-19066 filed in the Japan Patent Office on Jan. 28, 2003, the entire contents of which are hereby incorporated by reference.

What is claimed is:

1. A semiconductor device, comprising:
   a channel region of a first conductivity type formed at a surface layer portion of a semiconductor substrate;
   a source region of a second conductivity type which is different from the first conductivity type, the source region being formed at a rim of a trench having a depth sufficient to penetrate through the channel region;
   a drain region of the second conductivity type formed at a region adjacent to a bottom of the trench;
   a gate insulating film formed along an inner side wall of the trench;
   a gate electrode arranged in the trench so as to be opposed to the channel region with the gate insulating film interposed therebetween;
   at least one conductive layer formed in the trench so as to be nearer to the drain region than the gate electrode; and
   an insulating layer surrounding the conductive layer to electrically insulate the conductive layer from the gate electrode and the drain region.

2. A semiconductor device according to claim 1, wherein the conductive layer is made of polysilicon which is made conductive by introduction of an impurity.

3. A semiconductor device according to claim 1, wherein the at least one conductive layer comprises a plurality of conductive layers, wherein the insulating layer is further arranged between the plurality of conductive layers.

4. A semiconductor device according to claim 1, wherein the inner side wall of the trench has a substantially flat face and the flat face is a face in the channel region, the face having a specific plane direction of (1, 0, 0) to give a low resistance when electric current flows along the face.

5. A manufacturing method of a semiconductor device comprising: a channel region of a first conductivity type formed at a surface layer portion of a semiconductor substrate; a source region of a second conductivity type which is different from the first conductivity type, the source region being formed at a rim of a trench having a depth sufficient to penetrate through the channel region; a drain region of the second conductivity type formed at a region adjacent to a bottom of the trench; a gate insulating film formed along an inner side wall of the trench; a gate electrode arranged in the trench so as to be opposed to the channel region with the gate insulating film interposed therebetween; at least one conductive layer formed in the trench so as to be nearer to the drain region than the gate electrode; and an insulating layer surrounding the conductive layer to electrically insulate the conductive layer from the gate electrode and the drain region, the method comprising:
   a step of forming an epitaxial layer of the second conductivity type at a surface layer portion of a semiconductor substrate;
   a step of forming the trench at the epitaxial layer;
   a step of forming a first insulating layer at a bottom of the trench;
   a step of forming the conductive layer on the first insulating layer in the trench after the step of forming the first insulating layer;
   a step of forming a second insulating layer at an exposed surface of the conductive layer after the step of forming the conductive layer, the second insulating layer composing the insulating layer together with the first insulating layer;
   a step of forming the gate insulating film along the inner side wall of the trench;
   a step of forming the gate electrode in the trench, the gate electrode being electrically insulated from the conductive layer by the insulating layer;
   a step of forming the channel region of the first conductivity type at the epitaxial layer, the channel region being to be opposed to the gate electrode with the gate insulating film interposed therebetween; and
   a step of forming the source region of the second conductivity type at a region of the epitaxial layer corresponding to a rim of the trench.

6. A manufacturing method of a semiconductor device according to claim 5, wherein
   the step of forming the first insulating layer includes a step of forming a sacrificial oxide film by performing thermal oxidation for an inner wall of the trench and a step of removing the sacrificial oxide film with a portion thereof existing at a bottom of the trench being left, and
   the step of forming the second insulating layer includes a step of oxidizing an exposed surface of the conductive layer.

7. A manufacturing method of a semiconductor device according to claim 5, wherein the step of forming the gate electrode includes a step of forming a polysilicon film which is made conductive by introduction of an impurity.

8. A semiconductor device according to claim 2, wherein the at least one conductive layer comprises a plurality of conductive layers, wherein the insulating layer is further arranged between the plurality of conductive layers.

9. A semiconductor device according to claim 2, wherein the inner side wall of the trench has a substantially flat face and the flat face is a face in the channel region, the face having a specific plane direction of (1, 0, 0) to give a low resistance when electric current flows along the face.

10. A semiconductor device according to claim 3, wherein the inner side wall of the trench has a substantially flat face and the flat face is a face in the channel region, the face having a specific plane direction of (1, 0, 0) to give a low resistance when electric current flows along the face.

11. A semiconductor device according to claim 8, wherein the inner side wall of the trench has a substantially flat face and the flat face is a face in the channel region, the face having a specific plane direction of (1, 0, 0) to give a low resistance when electric current flows along the face.

12. A manufacturing method of a semiconductor device according to claim 6, wherein the step of forming the gate electrode includes a step of forming a polysilicon film which is made conductive by introduction of an impurity.

* * * * *